United States Patent [19]

Moeller

[11] Patent Number: 4,681,984
[45] Date of Patent: Jul. 21, 1987

[54] SOLAR CELL COMPRISING A SEMICONDUCTOR BODY FORMED OF AMORPHOUS SILICON AND HAVING A LAYER SEQUENCE P-SIC/I/N

[75] Inventor: Matthias Moeller, Munich, Fed. Rep. of Germany

[73] Assignee: Siemens Aktiengesellschaft, Berlin and Munich, Fed. Rep. of Germany

[21] Appl. No.: 837,814

[22] Filed: Mar. 10, 1986

[30] Foreign Application Priority Data

Apr. 11, 1985 [DE] Fed. Rep. of Germany ....... 3513012

[51] Int. Cl.$^4$ ............................................. H01L 31/06
[52] U.S. Cl. .................................. 136/258; 136/259; 357/30; 357/59
[58] Field of Search ........................ 136/258 AM, 259; 357/30, 59 C, 90

[56] References Cited

U.S. PATENT DOCUMENTS 4,581,476  4/1986  Yamazaki ................... 136/258 AM

FOREIGN PATENT DOCUMENTS

| 58-132984 | 8/1983 | Japan | 136/258 AM |
| 59-54274 | 3/1984 | Japan | 136/258 AM |
| 59-52883 | 3/1984 | Japan | 136/258 AM |
| 60-240165 | 11/1985 | Japan | 136/258 AM |

OTHER PUBLICATIONS

M. Gorn, et al, *Proceedings 6th E.C. Photovoltaic Solar Energy Conf.* (1985), Reidel Pub. Co., pp. 707–711.
J. Appl. Phys. 54 (11), Nov. 1983, pp. 6705–6707, "Amorphous Silicon Solar Cells with Graded Boron-- Doped Active Layers", Porponth Sichanugrist et al.
Appl. Phys. Lett. 44 (11), Jun. 1, 1984, pp. 1092–1094, "High Performance Hydrogenated Amorphous Si Solar Cells with Graded Boron-Doped Intrinsic Layers Prepared from Disilane at High Deposition Rates" Tsutomu Matsushita et al.
Technical Digest of the Internaional PVSEC-1, Kobe, Japan, "Light-Induced Change in Pin and Nip-Based a-Si:H Solar Cells", Yoshiyuki Uchida et al, pp. 217–220, Published Nov. 1984.

*Primary Examiner*—Aaron Weisstuch
*Attorney, Agent, or Firm*—Hill, Van Santen, Steadman & Simpson

[57] ABSTRACT

A solar cell comprises a semiconductor body formed of amorphous silicon and has a layer sequence formed of a p-type SiC layer, an intrinsic layer (i), and an n-type layer (n). In order to improve stability behavior, the pin solar cell has a transparent base electrode formed of stannic oxide, and has a phosphorus doping profile in the intrinsic layer i which rises in direction toward an i/n junction. It is irradiated from the p-side of the layer sequence.

8 Claims, 2 Drawing Figures

SOLAR CELL COMPRISING A SEMICONDUCTOR BODY FORMED OF AMORPHOUS SILICON AND HAVING A LAYER SEQUENCE P-SIC/I/N

BACKGROUND OF THE INVENTION

The invention relates to a solar cell comprising a transparent base electrode preferably formed of doped stannic oxide and comprising a semiconductor body formed of amorphous silicon which contains an intrinsic (i) layer between a p-SiC layer and an n-doped layer, said (i) layer having a phosphorus doping.

*J. Appl. Phys.* 54 (11), pages 6705 through 6707 as well as *Appl. Phys. Letters* 44 (11), pages 1092 through 1094, both incorporated herein by reference, disclose solar cells which comprise a boron doping profile in the i-layer. A high efficiency of up to 9.45% and good fill factors of 0.72 are thus achieved. The cells are formed on glass substrates and the light is incident from the p-side.

German Patent Application P 24 39 088.5, corresponding to U.S. Ser. No. 739,702, filed May 31, 1985, incorporated herein by reference, proposes a solar cell wherein the light is incident from the n-side and which comprises a linearly decreasing boron doping profile in the direction of the i/n junction in order to improve the stability.

Thin film solar cells of amorphous silicon (a-Si) having the layer sequence p-SiC/i/n generally exhibit what is referred to as the Staebler-Wronski effect to a more or less pronounced degree. Upon illumination, particularly when the cell is operated in an open circuit condition, i.e. a no-load voltage is present, a reversible decrease of the efficiency (for example by about 18% for an illumination of 100 mW/cm$^2$ having a time duration of 16 hours) can occur as a result of this effect. In this case, reversible means that the initial values of the efficiency can be achieved again after 30 minutes by tempering the cell at, for example, 180° C. Although the decrease of the efficiency diminishes with time, such cells can only be employed for technical applications under certain conditions.

The *Technical Digest of the International PVSECH-1*, Kobe, Japan, pp. 217–220, incorporated herein by reference, discloses a solar cell of the type initially cited which achieves a reduced light aging by means of a phosphorus level of about 0.5 ppm which is constant over the i-layer. The improvement in stability thus achieved is, however, too low due to the low level of phosphorus concentration. Use of higher levels of phosphorus would lead to a great reduction in efficiency.

SUMMARY OF THE INVENTION

An object of the invention is to prevent the above-described light aging and to create a stable solar cell with high efficiency which does not exhibit the Staebler-Wronski effect.

This object is achieved by a solar cell of the type initially cited in that the intrinsic layer comprises a phosphorus doping profile which rises in the direction of the i/n junction.

It is within the framework of the invention that the phosphorus concentration at the p-SiC/i junction amounts to 0 ppm in the amorphous silicon (a-Si) and rises to values between 3 and 10 ppm at the i/n junction. A corresponding phosphorus concentration gradient is established in the amorphous silicon. The entrainment of boron into the i-layer from the underlying p-layer is over-compensated by the phosphorus doping. The phosphorus component in the reaction gas is increased in linear fashion, for example, and rises up to 6 ppm phosphine (PH$_3$) with reference to the reaction gas silane (SiH$_4$).

DESCRIPTION OF THE PREFERRED EMBODIMENTS

Figure 1:
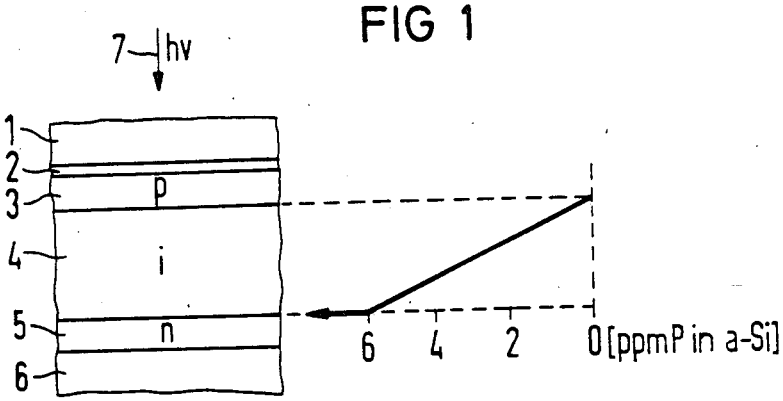
FIG. 1 is a schematic structure of a solar cell with a phosphorus doping profile placed next to it.

In FIG. 1, reference numeral 1 shows a substrate body of glass which identifies the side to be illuminated. Conductive stannic oxide layer 2 of 500 nm thickness is doped with fluorine (blooming, 20Ω□). Amorphous silicon layer 3 of 10 nm thickness is doped with boron and carbon (C). Amorphous silicon layer 4 of 500 nm thickness is intrinsic and has a graded phosphorus doping profile. Layer 4 may have a thickness between 0.2 and 1.0 μm. Amorphous silicon layer 5 of 15 nm thickness is n-doped. Silver layer 6 of 2 nm thickness is provided as a reflective rear surface electrode for increasing the light reflection. Finally, reference numeral 7 shows the direction of the incident light rays (hv).

Figure 2:
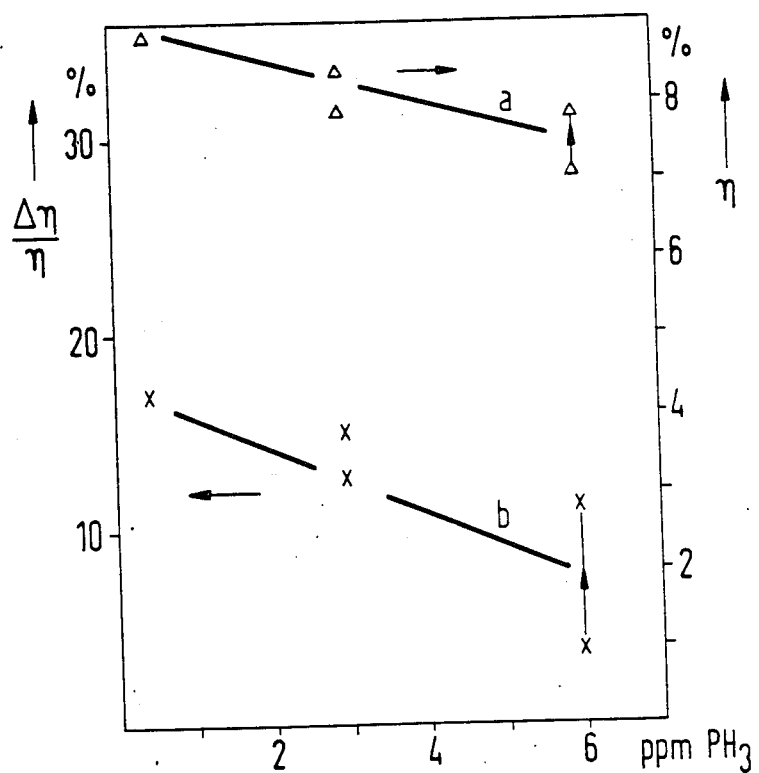
FIG. 2 illustrates in curve a the efficiency $\eta$ before illumination (right ordinate), and in curve b the relative decrease in efficiency ($\Delta\eta/\eta$) in percent (left ordinate) as a result of a 16-hour 100 mW/cm$^2$ illumination without load resistance (Staebler-Wronski effect) dependent on phosphorus concentration, and wherein the abscissa shows the final value at the i-n junction of phosphine in the silane.

As may be derived from FIG. 2, the light aging of cells without load resistance and with the (linear) phosphorus doping profile in the intrinsic layer exhibits reductions of the efficiency $\eta$ of only 4% to 10%, whereas cells without a phosphorus profile exhibit an 18% reduction in efficiency.

Although the efficiency of cells with 6 ppm ultimate phosphine concentration is about 10% lower than for cells with no phosphine, the stability of the cells of the invention is significantly better in comparison to the known arrangements.

Although various minor changes and modifications might be proposed by those skilled in the art, it will be understood that I wish to include within the claims of the patent warranted hereon, all such changes and modifications as reasonably come within my contribution to the art.

I claim as my invention:

1. A solar cell, comprising in sequence:
   a transparent base electrode comprising doped stannic oxide;
   a semiconductor body comprising amorphous silicon with an intrinsic i-layer between a p-type SiC layer and an n-type layer, said p-type SiC layer being in contact with the transparent base electrode;
   said intrinsic layer (i) having a phosphorus doping profile rising in the direction towards the i/n junction between the n-type layer and i-layer.

2. A solar cell according to claim 1 wherein the concentration of the phosphorus at the p-SiC/i junction is 0 ppm and rises to a value between 3 and 10 ppm at said i/n junction.

3. A solar cell according to claim 1 wherein the thickness of said i-layer is between 0.2 and 1.0 μm.

4. A solar cell according to claim 1 wherein said transparent electrode comprises stannic oxide doped with fluorine.

5. A solar cell according to claim 1 wherein the doping profile is a linear rise.

6. A solar cell according to claim 1 wherein said phosphorus doping profile is such that the phosphorus doping is substantially zero at the junction between the p-SiC layer and the i layer, and rises substantially linearly until said i/n junction.

7. A solar cell, comprising:
a semiconductor body having at one side a substantially reflective rear surface electrode layer and at the other side a substantially transparent layer through which incident light enters;
said semiconductor body being formed of amorphous material and comprising an intrinsic layer with a p-doped layer at one side thereof adjacent the substantially transparent base and an n-doped layer at an opposite side adjacent the reflective layer; and
said intrinsic layer being phophorus doped with a rising doping profile beginning substantially at the junction between the p-type layer and the intrinsic layer and wherein the doping profile stops rising substantially at the junction between the intrinsic layer and the n-doped layer.

8. A solar cell accprding to claim 7 wherein the doping profile is substantially linear.

* * * * *